ature Patent [19]

United States Patent [19]

Levine et al.

[11] 4,012,536

[45] Mar. 15, 1977

[54] ELECTRON BEAM RECORDING MEDIUM COMPRISING 1-METHYLVINYL METHYL KETONE

[75] Inventors: Aaron William Levine, Kendall Park; Michael Kaplan, Franklin Township, both of N.J.

[73] Assignee: RCA Corporation, New York, N.Y.

[22] Filed: Aug. 14, 1975

[21] Appl. No.: 604,776

Related U.S. Application Data

[62] Division of Ser. No. 314,975, Dec. 14, 1972, abandoned.

[52] U.S. Cl. ............................ 427/43; 96/35.1; 96/67; 96/115 R; 96/36; 204/159.14; 204/159.18; 204/159.21; 427/44
[51] Int. Cl.$^2$ .................. B05C 5/00; G03C 1/68
[58] Field of Search ............... 96/35, 35.1, 67, 36, 96/115 R; 118/49.5; 250/65, 49.5, 492; 260/63 R; 427/43, 44; 204/159.14, 159.18, 159.21

[56] References Cited

UNITED STATES PATENTS

| | | | |
|---|---|---|---|
| 2,892,712 | 6/1959 | Plambeck | 96/35.1 |
| 3,201,239 | 8/1965 | Neugebauer et al. | 96/36.3 |
| 3,544,790 | 12/1970 | Brown | 96/35.1 |
| 3,661,582 | 5/1972 | Broyde | 96/91 D |
| 3,674,591 | 7/1972 | Boyd | 96/35.1 |
| 3,764,501 | 10/1973 | Hori et al. | 96/115 P |
| 3,769,023 | 10/1973 | Lewis et al. | 96/115 P |
| 3,770,433 | 11/1973 | Bartelt | 96/35.1 |
| 3,794,510 | 2/1974 | Scala et al. | 96/35.1 |
| 3,808,155 | 4/1974 | Broyde | 96/91 N |
| 3,914,462 | 10/1975 | Morisnita et al. | 427/43 |
| 3,931,435 | 1/1976 | Gipstein et al. | 427/43 |
| 3,935,332 | 1/1976 | Poliniak et al. | 427/43 |
| 3,940,507 | 2/1976 | Fech et al. | 96/67 X |

OTHER PUBLICATIONS

Wissbrun, "The Photolysis of Polymethylvinyl Ketone and Polymethyl Isoproponyl Ketone," JACS, v. 81, 1959, p. 58.

*Primary Examiner*—Edward C. Kimlin
*Attorney, Agent, or Firm*—G. H. Bruestle; B. E. Morris

[57] ABSTRACT

Recording medium comprising a film of a polymer of 1-methylvinyl methyl ketone on a support is suitable for recording information with electron beams. This recording medium has high resolution and good sensitivity.

7 Claims, 2 Drawing Figures

ELECTRON BEAM RECORDING MEDIUM COMPRISING 1-METHYLVINYL METHYL KETONE

This is a division of application Ser. No. 314,975, filed 12-14-72, now abandoned.

This invention relates to novel electron beam recording media. More particularly, this invention relates to recording media for recording with electron beams carrying video information which have high resolution.

BACKGROUND OF THE INVENTION

Recording media which are sensitive to light, i.e., a photoresist film on a support, are well known. Such media, when exposed to light containing an information pattern, change their solubility characteristics in those areas exposed to the light pattern. Photoresists are developed by contacting with a solvent which dissolves the more soluble portions, leaving the less soluble portions in a pattern of peaks and valleys which represent the information pattern. Negative photoresists are initially soluble in the developer solution and the exposed portions become insolubilized; thus the information pattern is contained in the peaks. Positive photoresists become soluble in the exposed regions, thus the information pattern resides in the valleys.

Recently, suitably modulated electron beams have been substituted for electromagnetic radiation as the recording probe. An electron beam has shorter wavelengths than a light beam, and thus can be more highly focused and record more information in a specific volume. To take advantage of this, a suitable resist should be capable of resolving line widths smaller than the wavelength of near violet light. While some known photoresists are useful as electron beam resists as well, materials which have high resolution and improved sensitivity to electron beams are required for high density recording.

SUMMARY OF THE INVENTION

We have found that certain alpha, beta-unsaturated ketone polymers and copolymers are excellent positive electron beam resists, having high sensitivity. Further, the electron beam resists described herein, after development, display straight-walled, sharp information patterns which provide high resolution upon readout. Films of these polymers on suitable supports provide improved electron beam recording media.

DETAILED DESCRIPTION OF THE INVENTION

Figure 1:
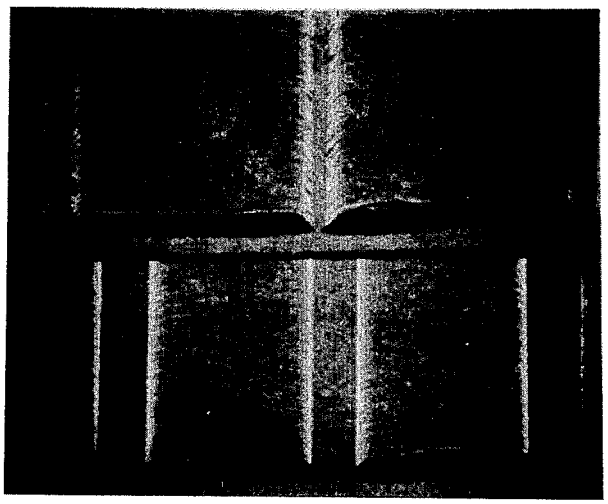
FIGS. 1 and 2 are electronmicrographs of developed information patterns in recording media described herein.

The alpha, beta-unsaturated ketone polymers found useful as electron beam resists are polymers of 1-methylvinyl methyl ketone and copolymers thereof with comonomers having vinyl unsaturation.

1-methylvinyl methyl ketone has the structural formula

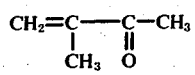

and is known to polymerize by free radical initiated addition polymerization. Copolymers can also be formed from mixtures of 1-methylvinyl methyl ketone with comonomers having >C=C< unsaturation. Suitable comonomers include, for example, acrylic monomers such as methyl acrylate, methyl methacrylate, ethyl acrylate, t-butyl methacrylate and the like, and vinyl-substituted aromatic comonomers such as styrene, vinyltoluene and the like. The presence of a comonomer is not required, but may serve to alter certain properties of the 1-methylvinyl methyl ketone polymer, such as solubility, hardness, processing and the like required for certain applications.

The above described polymers can be prepared by admixing the 1-methylvinyl methyl ketone and the comonomer, if employed, with a free radical initiator in a reaction vessel which can be sealed. A bulk polymerization can be effected, or a solution polymerization by adding a solvent. The mixture is heated under ambient pressure to initiate polymerization, suitably to a temperature range of from 50° to about 120° C.

Free radical initiators suitable for the polymerization are well known and include peroxides such as lauroyl peroxide, benzoyl peroxide, t-butyl perbenzoate, t-butyl peracetate, t-butyl hydroperoxide, di-t-butyl peroxide, and the like and azo initiators such as azobis-diisobutyronitrile, and the like.

When polymerization has been effected, the polymer product is isolated and purified. The polymer can be precipitated from solution by the addition of a nonsolvent, such as water, methanol, hexane and the like, and purified by reprecipitation from a solvent such as chloroform, acetone, methyl ethyl ketone, ethyl acetate and the like, with a nonsolvent.

In preparing the recording medium of the invention, the purified polymer is solution cast or spun onto the desired support. The nature of the support is conventional and is not part of this invention; suitable supports can be flexible, such as polyester tape or inflexible, such as glass plate, transparent or opaque, depending on the nature of the recording system in which it is to be employed. The concentration of the polymer in the solvent is adjusted so as to deposit a film of the desired thickness onto the support. The solvent is then removed in any convenient manner, as by drying, evaporating and the like.

An electrically conductive layer is also required. This can be provided either by a thin conductive film on the support, or on the polymeric layer. Suitable conductive substrates include metal coated plastics, such as aluminum vapor coated polyethylene terephthalate, conductive glass such as a tin oxide, or indium oxide coated glass, glass having a conductive metal film thereon, and the like. Alternatively, an electron permeable conductive layer can be formed on the polymer film by vapor deposition of a thin film of copper, nickel, aluminum, chromium or other conductive metal or alloy in known manner. The conductive layer is suitably from about 50–10,000, preferably 100–1000 angstroms in thickness.

The recording medium as described above is ready for exposure to electron beam recording. A scanning electron microscope is conveniently employed in known manner to record the desired information in the polymer film. Although the exact mechanism of recording is not known, it is believed the electron beam changes the solubility characteristic of the polymer by depolymerization or degradation of the molecular weight of the polymer during exposure.

Although the term electron beam has been used throughout the present specification, this term is meant to include beams of charged particles having very high energy and electromagnetic radiation such as x-rays, γ-rays and the like.

The recording medium is developed after exposure by immersing in a suitable solvent, or a mixture containing a solvent and a nonsolvent. Very fast-working solvents, such as ethyl acetate, are preferably diluted with a nonsolvent to decrease the rate of solution and avoid dissolution or undercutting of the nonexposed portions of the film. The time required for development or dissolution of exposed polymer is not critical and can vary up to about one-half hour, depending on the depth of the relief pattern desired, the polymer employed and the solvent. Overlong development times may result in dissolution of unexposed film and thus should be avoided. Generally 3–5 minutes is sufficient to develop suitable relief. Optimum solvent mixtures and development times for particular polymer films of particular thickness can be readily determined by a series of test runs by one skilled in the art.

The invention will be further illustrated by the following examples, but it is to be understood that the invention is not meant to be limited to the details described therein. In the examples, parts and percentages are by weight.

EXAMPLE 1

1-methylvinyl methyl ketone was purified by distillation. To a glass tube were charged 20.7 parts of the distillate, 0.2058 part of azobisdiisobutyronitrile initiator and 25 parts by volume of 4-methyl-2-pentanone. The tube was immersed in a dry ice-acetone bath (−78° C.) and then sealed. After allowing the tube to reach room temperature, it was immersed in an oil bath and maintained at 80° C. for 26 hours when the tube was removed and allowed to cool to room temperature. The contents of the tube were precipitated with methanol, dissolved in acetone and reprecipitated with methanol. The precipitate was washed with methanol, then with hexane and dried under vacuum at 35° C.

A 20.3% yield (4.2 parts) of a white powdered polymer was obtained.

EXAMPLE 2

A copolymer was prepared following the procedure of Example 1 employing 20.02 parts of 1-methylvinyl methyl ketone, 0.2618 part of initiator and 5.05 parts of methyl methacrylate as comonomer. The polymer product was precipitated with methanol and purified by reprecipitation from methyl ethyl ketone.

A 37.8% yield of a white solid polymer product was obtained having a molecular weight of 16,600, as determined by membrane osmometry.

EXAMPLE 3

A copolymer was prepared following the procedure of Example 1 employing 4.5 parts of 1-methylvinyl methyl ketone, 0.2254 part of initiator and 180 parts of methyl methacrylate.

A 73.7% yield of polymeric product was obtained.

EXAMPLE 4

A copolymer was prepared following the procedure of Example 1 employing 20 parts of 1-methylvinyl methyl ketone, 5 parts of ethyl acrylate and 0.260 part of initiator.

After 24 hours at 80° C. the product was precipitated with methanol, dissolved in methyl ethyl ketone and reprecipitated with methanol. The product was dried under vacuum at 50° C.

A 20.8% yield (5.2 parts) of a pale colored polymer product was obtained.

EXAMPLE 5

A copolymer was prepared following the procedure of Example 4 employing as the comonomer 5 parts of t-butyl methacrylate.

After 24 hours of reaction, the product was a dark red-brown, viscous solution. The product was precipitated with methanol, dissolved in methyl ethyl ketone and decolorized by treating with carbon. The solution was filtered and poured into methanol. The workup was repeated and the product finally dried at 50° C. under vacuum.

A 4.8% yield (1.2 parts) of a yellow polymer product was obtained.

EXAMPLE 6

A copolymer was prepared following the procedure of Example 4 employing as the comonomer 5.02 parts of styrene.

After reacting for 24 hours the product was precipitated with methanol, dissolved in methyl ethyl ketone, reprecipitated with methanol and dried under vacuum at 50° C.

A 34.8% yield (8.7 parts) of a white polymer was obtained.

EXAMPLE 7

Sixteen parts of a 1-methylvinyl methyl ketone distillate boiling at 92°–95° C. and 0.0376 part of initiator were charged to a glass tube, cooled to −78° C., the glass tube sealed and heated in an oil bath at 80° C. for 24 hours.

The product was dissolved in chloroform and precipitated with methanol to give a white solid. The solid product was washed with methanol and dried under vacuum.

A 43.6% yield (7.0 parts) of a white polymer was obtained. The molecular weight was 30,200 as determined by membrane osmometry.

EXAMPLE 8

The polymers of the preceding examples 1–7 were dissolved in 2-methoxyethyl acetate as about a 10% solution from which they were spin coated to a thickness of about 300–400 nm onto ½ × ½ inch plates of glass coated with a chromium/nickel alloy. The films were exposed with the beam of a scanning electron microscope at an accelerating potential of 5 kV and a beam current of 3 nA. An approximately Gaussian-shaped beam having a full width at half amplitude of about 0.6 micron was scanned to describe rasters on the surface of the films at various speeds, thereby varying the total exposure of the films to the beam.

The samples were developed in various solvents as set forth in the Table below by immersing the exposed film for about 4 minutes.

A 200 A thick layer of gold was evaporated onto the developed films which were then examined using the scanning electron microscope. The width of the two most heavily exposed rasters were determined from electronmicrographs which showed the trench geometry and the relief obtained.

The data are summarized in the Table below wherein $R_4$ is the most heavily exposed raster, using a scan rate of 2.5 cm/sec, and $R_3$ is the next most heavily exposed raster, using a scan rate of 10 cm/sec.

TABLE

| Polymer of Example | Development Solvent | Final Film thickness, nanometers | Width $R_4$, microns | Width $R_3$, microns |
|---|---|---|---|---|
| 1 | butyl acetate | 289 | 0.87 | 0.44 |
| 2 | 2:1 2-butoxyethanol/ ethyl acetate | 278 | 1.02 | 0.63 |
| 3 | 2:1 2-butoxyethanol/ ethyl acetate | 214 | 0.77 | 0.27 |
| 4 | pentyl propionate | 302 | 0.74 | * |
| 5 | 6:1 2-butoxyethanol/ ethyl acetate | 290 | 0.76 | * |
| 6 | 6:1 2-butoxyethanol/ ethyl acetate | 288 | 0.93 | * |
| 7 | 2:1 2-butoxyethanol/ ethyl acetate | 300 | 1.21 | 0.84 |

*No rasters were observed

Referring now to the Figures, FIG. 1 is an electronmicrograph of an exposed film of the polymer of Example 4 developed by immersing in a 6:1 mixture of 2-butoxyethanol/ and ethyl acetate for 7 minutes. The upper portion of the electronmicrograph shows rasters exposed at 10 cm/sec and the lower portion of the photo shows rasters exposed at 2.5 cm/sec. It can be seen that the rasters or trenches have excellent geometry, that is, a clearly defined, straight walled trench.

Figure 2:
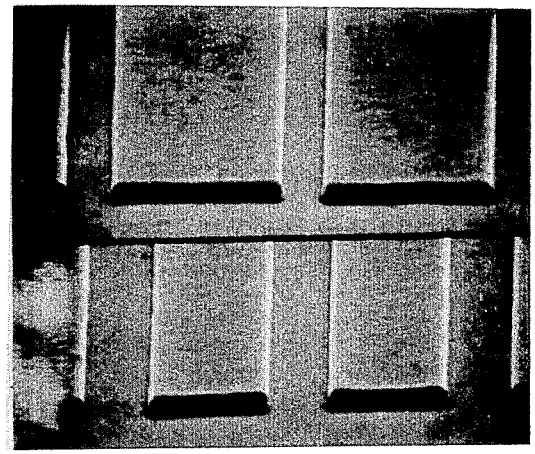

FIG. 2 is an electronmicrograph of an exposed film of the polymer of Example 7 developed by immersing the exposed film in a 2:1 mixture of 2-butoxyethanol and ethyl acetate for 7.25 minutes. The final film thickness was 300 nanometers. The upper portion of the electronmicrograph shows rasters exposed at 10 cm/sec. These rasters have an average width of about 0.84 microns. The lower portion of the electronmicrograph shows rasters exposed at 2.5 cm/sec. These rasters have an average width of about 1.21 microns.

We claim:

1. An electron beam recording medium which comprises a support, an electrically conductive layer and an electron beam-sensitive film thereon, said film consisting essentially of a polymer of 1-methylvinyl methyl ketone.

2. A medium according to claim 1 wherein the support has the conductive layer thereon.

3. A medium according to claim 1 having the conductive layer on the electron-beam sensitive film.

4. A medium according to claim 1 wherein the polymer is a 1-methylvinyl methyl ketone homopolymer.

5. A medium according to claim 1 wherein the polymer is a copolymer of 1-methylvinyl methyl ketone and a comonomer having vinyl unsaturation.

6. A medium according to claim 5 wherein the copolymer is derived from 1-methylvinyl methyl ketone and an acrylate or methacrylate monomer.

7. A medium according to claim 6 wherein the comonomer is ethyl acrylate.

* * * * *